United States Patent
Von Basse et al.

(10) Patent No.: US 6,181,183 B1
(45) Date of Patent: Jan. 30, 2001

(54) STEEP EDGE TIME-DELAY RELAY

(75) Inventors: Paul-Werner Von Basse, Wolfratshausen; Roland Thewes, Gröbenzell; Michael Bollu, München; Doris Schmitt-Landsiedel, Ottobrunn, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/269,047

(22) PCT Filed: Aug. 20, 1997

(86) PCT No.: PCT/DE97/01802

§ 371 Date: Mar. 18, 1999

§ 102(e) Date: Mar. 18, 1999

(87) PCT Pub. No.: WO98/12812

PCT Pub. Date: Mar. 26, 1998

(30) Foreign Application Priority Data

Sep. 18, 1996 (DE) .............................................. 196 38 163

(51) Int. Cl.[7] .................................................. H03K 5/13
(52) U.S. Cl. ............................................. 327/276; 327/278
(58) Field of Search ..................... 327/261, 262, 327/263, 276, 281, 288, 264, 278, 285; 326/27

(56) References Cited

U.S. PATENT DOCUMENTS

| | | | |
|---|---|---|---|
| 5,051,625 | * 9/1991 | Ikeda et al. .............................. | 326/57 |
| 5,180,938 | 1/1993 | Sin ........................................ | 327/288 |
| 5,598,111 | * 1/1997 | Enomoto ................................ | 326/83 |

FOREIGN PATENT DOCUMENTS

| | | | |
|---|---|---|---|
| 0 330 405 | 8/1989 | (EP) . | |
| 402206221 | * 8/1990 | (JP) ........................................ | 326/27 |
| 402266714 | * 8/1990 | (JP) ........................................ | 326/27 |

OTHER PUBLICATIONS

Patent Abstracts of Japan—58156226—publication date Sep. 17, 1983.

Patent Abstracts of Japan—07046098—publication date Feb. 14, 1995.

Patent Abstracts of Japan—07131310—publication date May 19, 1995.

* cited by examiner

*Primary Examiner*—Tuan T. Lam
(74) *Attorney, Agent, or Firm*—Schiff Hardin & Waite

(57) ABSTRACT

A circuit with a delay stage formed by an invertor having high-impedance transistors and, connected in series therewith, an invertor having low-impedance transistors MOS capacitors are provided between the gates of the transistors of the low-impedance invertor and the output of the delay stage. By means of this circuit, delay stages with steep edges can be realized with comparatively less outlay on components.

2 Claims, 1 Drawing Sheet

STEEP EDGE TIME-DELAY RELAY

BACKGROUND OF THE INVENTION

1. Field of the Invention

The present invention relates to a logic circuit wherein delay stages having steep edges are realized with a relatively minor component outlay.

2. Description of the Prior Art

In logic circuits, delayed edges are frequently required in order to control sequential operations. However, long delays also simultaneously manifest a slowing-down of the edges and/or a reduction in the edge steepness. Such delays may be realized by a large number of simple circuits; for example, by invertor cascades. A series circuit formed by an RC element and/or an integrator and a downstream Schmitt trigger, for example, constitutes one measure for overcoming this problem. The disadvantage of this is that such a circuit is relatively complicated.

SUMMARY OF THE INVENTION

The present invention is based on the object of specifying a delay stage with steep edges which requires as little circuitry as possible.

Accordingly, in an embodiment of the present invention, a circuit with a delay stage is provided which includes: a first inverter having both a p-channel MOS transistor and an n-channel MOS transistor; a second inverter having both a p-channel MOS transistor and a n-channel MOS transistor, wherein the second inverter is connected in series with the first inverter such that an input of the first inverter corresponds to an input of the delay stage and an output of the second inverter corresponds to an output of the delay stage; a p-channel MOS transistor connected as a capacitor between a gate of the p-channel MOS transistor of the second inverter and the output of the delay stage; and an n-channel MOS transistor connected as a capacitor between the output of the delay stage and a gate of the n-channel MOS transistor of the second inverter.

In an embodiment, both the p-channel MOS transistor and the n-channel MOS transistor of the first inverter have a significantly higher impedance than both the p-channel MOS transistor and the n-channel MOS transistor of the second inverter in an ON state.

Additional features and advantages of the present invention are described in, and will be apparent from, the Detailed Description of the Preferred Embodiments and the Description of the Drawings.

DETAILED DESCRIPTION OF THE PREFERRED EMBODIMENTS

Figure 1:
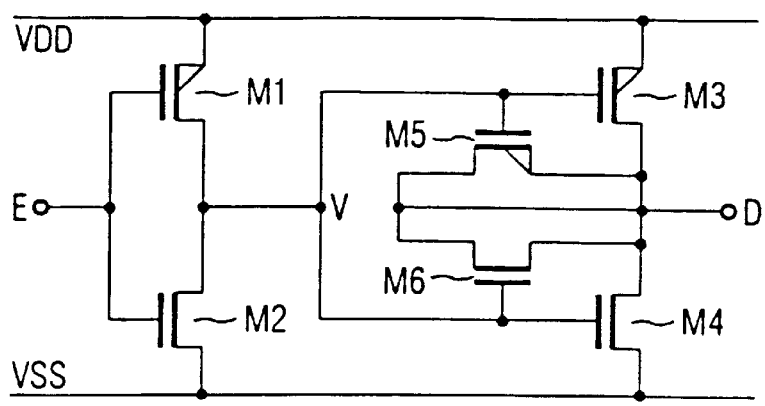
FIG. 1 shows a circuit diagram of the delay stage according to the present invention.

FIG. 1 illustrates a delay stage having two invertors and two capacitors. A first invertor, which is connected on the input side to an input E of the delay stage, has a p-channel MOS transistor M1 and an n-channel transistor M2, which are both preferably designed such that they are very narrow and long. Such design ensures that in the ON state transistors M1 and M2 carry only very small currents or have a very high impedance. A first terminal of the transistor M1 is connected to a supply voltage VDD and a second terminal of the transistor M1 is connected to an output V of the first invertor. Correspondingly, a first terminal of the transistor M2 is connected to the output V and a second terminal of the transistor is connected to the reference-earth potential VSS. The second invertor has a p-channel MOS transistor M3 and an n-channel MOS transistor M4, which both have a relatively low impedance in the ON state. The transistors M1 and M2 preferably should have impedances which, in the ON state, are higher at least by a factor of 10 than those of the transistors M3 and M4.

The two gates of the transistors M3 and M4 are connected to the output V of the first invertor stage and form the input of the second invertor stage. A first terminal of the transistor M3 is connected up to the supply voltage VDD and a second terminal of the transistor M3 is connected up to the output D of the delay stage. Correspondingly, a first input of the transistor M4 is connected to the output D and a second terminal of the transistor M4 is connected to reference-earth potential VSS. A first capacitor is situated between the output D and the gate of the transistor M3, and a second capacitor is situated between the output D and the gate of the transistor M4. The first capacitor is formed by a MOS transistor M5. The gate of transistor M5 is connected to the gate of the transistor M3 and the source and drain of transistor M5 are connected to the output D. The second capacitor is formed by an n-channel MOS transistor M6. The gate of transistor M6 is connected to the gate of the transistor M4 and the source and drain of transistor M6 are connected to the terminal D.

The essential capacitance of these capacitors, formed by the transistors M5 and M6, is formed by the capacitance between the gate and channel as soon as the voltage between the gate and source terminals is greater than the threshold voltage of the transistors M5 and M6. As soon as the voltage between the output V of the first invertor and the output D of the second invertor is more positive than a threshold Vtn, the transistor M6 forms a channel and, thus, a large capacitance. Below this threshold, the channel is not present and only small parasitic capacitances act. The same applies to the second capacitor which is formed by the transistor M5. In this transistor M5, a channel is formed only when the voltage between the output V and the output D is more negative than a threshold Vtp of the transistor M5. In the middle range, in which the differential voltage between the voltage VV at the output V and the voltage VD at the output D is less than or equal to the threshold Vtn of the n-channel transistor M6 and greater than or equal to the threshold Vtp of the p-channel transistor M5, only the comparatively small parasitic capacitances act in the case of the two capacitors formed by the transistors M5 and M6.

Figure 2:
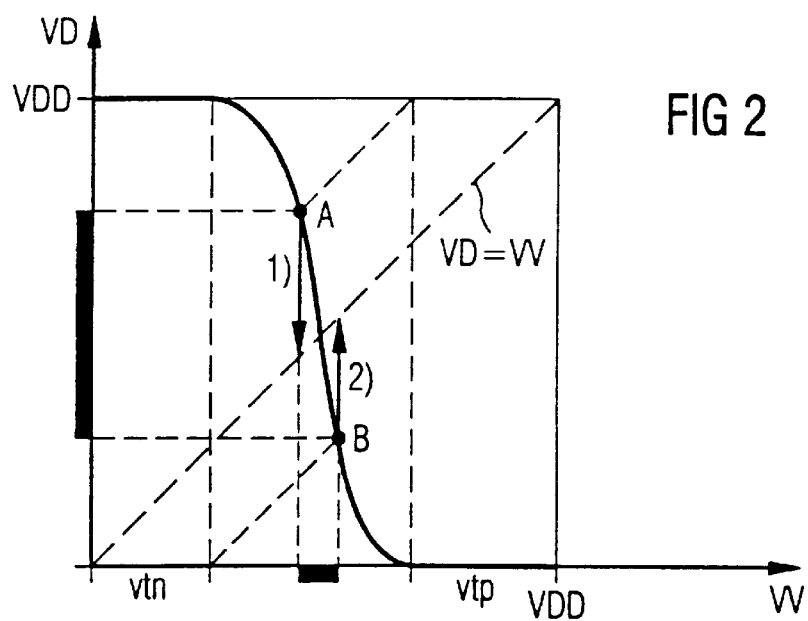
FIG. 2 shows a voltage/voltage diagram associated with the circuit illustrated in FIG. 1.

This middle range is referred to as a capacitance gap and is indicated by the letters A and B at its range boundaries in FIG. 2. In FIG. 2, VD is plotted on the ordinate and the voltage VV is plotted on the abscissa. In each case between zero and VDD, a value of approximately VDD results for the voltage VD for small values of VV and a value of approximately zero results for the voltage VD for large values of VV. An s-shaped transition containing the abovementioned range between A and B occures in a voltage range Vtn≦VV≦VDD−Vtt.

Outside the so-called capacitance gap, the large capacitances ensure that the delay of the delay stage according to the present invention is comparatively long and thus the edge steepness at the output D is comparatively low. Within the capacitance gap, in contrast, the delay of the delay stage is short and, thus, the edge steepness at the output D is comparatively high. The steep profile lies directly in the switch-over range of the invertors, with the result that downstream invertors switch through with steep edges. The delay and the shallow edges lie outside the switch-over range of the CMOS circuits but consequently do not interfere.

Figure 3:
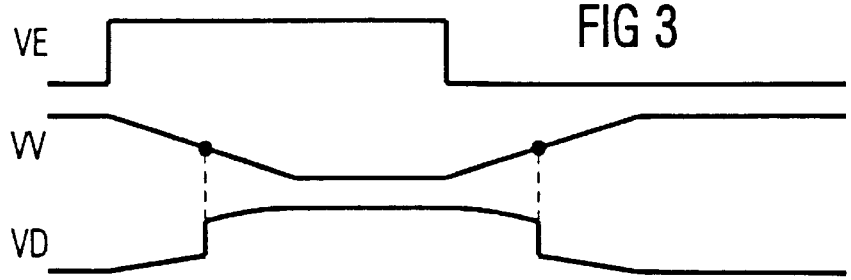
FIG. 3 shows voltage timing diagrams associated with the circuit shown in FIG. 1.

A rectangular-waveform input voltage VE at the input E, the voltage VV at the output V of the first invertor stage and the voltage VD at the output D of the delay stage are illustrated with temporal correlation in FIG. 3. This makes it clear that the voltage VV drops relatively slowly after the rising edge of the voltage VE and rises again relatively slowly after the falling edge of the voltage VE. In a middle region of the slowly falling and slowly rising ranges of the voltage VV, a steep rise and a steep fall, respectively, of the voltage VD occurs at the output D.

Although the present invention has been described with reference to specific embodiments, those of skill in the art will recognize that changes may be made thereto without departing from the spirit and scope of the invention as set forth in the hereafter appended claims.

What is claimed is:

1. A circuit with a delay stage, comprising:

a first inverter having both a p-channel MOS transistor and an n-channel MOS transistor;

a second inverter having both a p-channel MOS transistor and an n-channel MOS transistor, the second inverter connected in series with the first inverter wherein an input of the first inverter corresponds to an input of the delay stage and an output of the second inverter corresponds to an output of the delay stage;

a p-channel MOS transistor connected as a capacitor between a gate of the p-channel MOS transistor of the second inverter and the output of the delay stage; and an n-channel MOS transistor connected as a capacitor between the output of the delay stage and a gate of the n-channel transistor of the second inverter.

2. A circuit with a delay stage as claimed in claim 1, wherein, in an ON stage, both the p-channel MOS transistor and the n-channel MOS transistor of the first inverter have a significantly higher impedance than both.

* * * * *